United States Patent
Ohki et al.

(10) Patent No.: US 8,178,281 B2
(45) Date of Patent: May 15, 2012

(54) METHOD FOR IMPROVING SENSITIVITY OF RESIST

(75) Inventors: Hirofumi Ohki, Akishima (JP); Ayako Nishioka, Chiba (JP); Takashi Ohkubo, Chiba (JP)

(73) Assignee: Showa Denko K.K., Tokyo (JP)

( * ) Notice: Subject to any disclaimer, the term of this patent is extended or adjusted under 35 U.S.C. 154(b) by 0 days.

(21) Appl. No.: 13/059,877

(22) PCT Filed: Aug. 20, 2009

(86) PCT No.: PCT/JP2009/064574
§ 371 (c)(1),
(2), (4) Date: Feb. 18, 2011

(87) PCT Pub. No.: WO2010/021359
PCT Pub. Date: Feb. 25, 2010

(65) Prior Publication Data
US 2011/0143283 A1    Jun. 16, 2011

(30) Foreign Application Priority Data
Aug. 20, 2008 (JP) ................................ 2008-211707

(51) Int. Cl.
G03C 5/00 (2006.01)

(52) U.S. Cl. ............ 430/296; 430/5; 430/330; 430/527; 430/529; 430/942

(58) Field of Classification Search .............. 430/5, 296, 430/330, 527, 529, 942
See application file for complete search history.

(56) References Cited

U.S. PATENT DOCUMENTS

| | | | |
|---|---|---|---|
| 5,256,454 A | 10/1993 | Murai et al. | |
| 5,437,893 A | 8/1995 | Murai et al. | |
| 5,589,270 A | 12/1996 | Murai et al. | |
| 5,648,453 A | 7/1997 | Saida et al. | |
| 5,688,873 A | 11/1997 | Saida et al. | |
| 7,052,820 B2 * | 5/2006 | Rottstegge et al. | 430/270.1 |
| 7,887,906 B2 | 2/2011 | Ohkubo et al. | |
| 2007/0181857 A1 | 8/2007 | Nishioka et al. | |
| 2007/0252111 A1 | 11/2007 | Ohkubo et al. | |
| 2009/0123771 A1 | 5/2009 | Ohkubo et al. | |

FOREIGN PATENT DOCUMENTS

| | | | |
|---|---|---|---|
| EP | 1818369 A2 | | 8/2007 |
| JP | 02-189333 A | | 7/1990 |
| JP | 4-032848 A | | 2/1992 |
| JP | 7-048436 A | | 2/1995 |
| JP | 10-186669 A | | 7/1998 |
| JP | 2003-057802 A | | 2/2003 |
| JP | 2003-100609 A | | 4/2003 |
| JP | 2006-077236 A | | 3/2006 |
| JP | 2006-117925 A | | 5/2006 |
| JP | 2008-095060 A | | 4/2008 |
| JP | 2011170207 | * | 9/2011 |
| WO | 98/03499 A1 | | 1/1998 |

OTHER PUBLICATIONS

Cho, W., et al., "Detectability and printability of EUVL mask blank defects for the 32 nm HP node," (http://www.osti.gov/bridge/servlets/purl/918124-unRCSF).

Clark, N., et al., "Time-dependent exposure dose of hydrogen silsesquioxane when used as a negative electron-beam resist," The Journal of Vacuum Science & Technology B, vol. 24, November/December pp. 3073-3076 (2006).

Ikenoue, Y., et al., "Electrochemical Studies of Self-Doped Conducting Polymers: Verification of the 'Cation-Popping' Doping Mechanism," Synthetic Metals, vol. 30, pp. 305-319 (1989).

Sasaki, S., et al., "Photomask process development for next generation lithography," Photomask and Next-Generation Lithography Mask Technology XII, Proceedings of SPIE, vol. 5853, pp. 277-288.

* cited by examiner

*Primary Examiner* — Christopher Young
(74) *Attorney, Agent, or Firm* — Sughrue Mion, PLLC

(57) ABSTRACT

It is an object of the present invention to improve sensitivity of a resist made from hydrosilsesquioxane when a pattern is formed in the resist by irradiation with a charged particle beam. The method for improving sensitivity of a resist of the present invention is a method to improve sensitivity of a resist formed from hydrosilsesquioxane to a charged particle beam when a pattern is formed in the resist by irradiation with a charged particle beam, and is characterized by including prebaking a resist formed from hydrosilsesquioxane and applied onto a substrate at t° C. ($20 \leq t \leq 300$), applying a composition containing a water-soluble conductive polymer compound to a charged particle beam irradiation surface of the prebaked resist, baking the thus applied composition at T° C. ($0 \leq T < t+40$) and then irradiating the resist with a charged particle beam.

22 Claims, No Drawings

METHOD FOR IMPROVING SENSITIVITY OF RESIST

TECHNICAL FIELD

The present invention relates to a method for improving sensitivity of a resist, and more particularly to a method to improve sensitivity of an electron beam-sensitive resist when a pattern is formed in the resist by means of a charged particle beam.

BACKGROUND ART

When drawing of a pattern by an electron beam is carried out in lithography that is a semiconductor production process, the electron beam is not radiated rectilinearly because the resist is electrostatically charged, and as a result, shift of a position of the pattern occurs. In order to solve such a problem, an antistatic agent containing a water-soluble conductive polymer has been applied to the resist (e.g., patent literature 1).

In the recent circumstances where fine processing of a resist to give a line width of not more than 50 nm is required, even slight influence of an antistatic agent on the resist markedly impair rectangular properties of the shape of the resist, and therefore, by the addition of a biosurfactant, an aliphatic basic compound and a water-soluble polymer to the antistatic agent containing a water-soluble conductive polymer, reduction of the influence of the antistatic agent on the resist has been carried out (e.g., patent literature 2, patent literature 3, patent literature 4).

On the other hand, it is known that hydrosilsesquioxane (also referred to as "HSQ" hereinafter), which is a resist of non-chemical amplification type having been used as an interlayer dielectric in the process for manufacturing LSI device in the past, is crosslinked when it is irradiated with an electron beam. Taking advantage of these characteristics, the HSQ has been now widely used as a negative electron beam resist for electron beam drawing. Since the HSQ has high resolution and rigidity, its effectiveness has been found in the production of patterns of nanometer size and in the production of nanoimprint templates The HSQ, however, has low sensitivity to electron beam, and therefore, drawing of a desired pattern takes a long time, resulting in a disadvantage of bad processing efficiency. Moreover, when the HSQ is used as a negative electron beam resist, a change of sensitivity of the HSQ with time after formation of a coating film has been observed (e.g., non patent literature 1), and there is a problem that the electron beam drawing sensitivity is lowered.

Accordingly, it has been desired to improve sensitivity of HSQ and to improve lowering of sensitivity of HSQ with time, while making the best use of the excellent characteristics of HSQ that fine processing is possible.

CITATION LIST

Patent Literature

Patent literature 1: Japanese Patent Laid-Open Publication No. 32848/1992

Patent literature 2: Japanese Patent Laid-Open Publication No. 077236/2006

Patent literature 3: Japanese Patent Laid-Open Publication No. 117925/2006

Patent literature 4: European Patent Laid-Open Application No. 1818369

Non Patent Literature

Non patent literature 1: *the Journal of Vacuum Science & Technology*, Vol. B-24, November/December, 2006

SUMMARY OF INVENTION

Technical Problem

It is an object of the present invention to improve sensitivity of a resist formed from hydrosilsesquioxante when a pattern is formed in the resist by irradiation with a charged particle beam and to improve stability of sensitivity of a resist during storage after formation of a coating film of the resist.

Solution to Problem

The present inventors have earnestly studied, and as a result, they have found that by applying a water-soluble conductive polymer compound to a surface of a resist formed from hydrosilsesquioxane, sensitivity of the resist to electron beam is improved in the irradiation with a charged particle beam, and besides, stability of sensitivity after the lapse of time becomes excellent. Based on the finding, the present invention has been accomplished.

The present invention relates to, for example, the following matters [1] to [15].

[1] A method for improving sensitivity of a resist, which is a method to improve sensitivity of a resist formed from hydrosilsesquioxane to a charged particle beam when a pattern is formed in the resist by irradiation with a charged particle beam, and comprises:

prebaking a resist applied onto a substrate and formed from hydrosilsesquioxane, at t° C. (20≦t≦300), applying a composition containing a water-soluble conductive polymer compound to a charged particle beam irradiation surface of the prebaked resist, baking the thus applied composition at T° C. (0≦T<t+40), and then irradiating the resist with a charged particle beam.

[2] The method for improving sensitivity of a resist as stated in [1], wherein the charged particle beam is an electron beam or an ion beam.

[3] The method for improving sensitivity of a resist as stated in [1] or [2], wherein the water-soluble conductive polymer compound is a π-conjugated conductive polymer compound having a Brønsted acid group or a group that is a salt of Brønsted acid.

[4] The method for improving sensitivity of a resist as stated in [3], wherein the Brønsted acid is sulfonic acid.

[5] The method for improving sensitivity of a resist as stated in [4], wherein the water-soluble conductive polymer compound contains a chemical structure represented by the following formula (1):

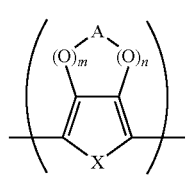

(1)

wherein m and n are each independently 0 or 1,

X is S, N—R¹ (R¹ is a group selected from the group consisting of a hydrogen atom, a straight-chain or branched saturated or unsaturated monovalent hydrocarbon group of 1 to 20 carbon atoms, a phenyl group and a substituted phenyl group) or O, A is a saturated or unsaturated hydrocarbon group of 1 to 4 carbon atoms, which has at least one substituent represented by —B—$SO_3^-M^+$ and forms a straight-chain structure together with —$(O)_m$— and —$(O)_n$—, the saturated or unsaturated hydrocarbon group of 1 to 4 carbon atoms may have, as a substituent, a straight-chain or branched saturated or unsaturated hydrocarbon group of 1 to 20 carbon atoms, a straight-chain or branched saturated or unsaturated alkoxy group of 1 to 20 carbon atoms, a hydroxyl group, a halogen atom, a nitro group, a cyano group, a trihalomethyl group, a phenyl group or a substituted phenyl group, B is —$(CH_2)_p$—$(O)_q$—$(CH_2)_r$—, p and r are each independently an integer of 0 to 3, q is 0 or 1, and $M^+$ is a hydrogen ion, an alkali metal ion or a quaternary ammonium ion.

[6] The method for improving sensitivity of a resist as stated in [4], wherein the water-soluble conductive polymer compound contains a chemical structure represented by the following formula (2):

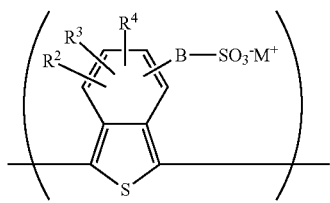

(2)

wherein $R^2$ to $R^4$ are each independently a hydrogen atom, a straight-chain or branched saturated or unsaturated hydrocarbon group of 1 to 20 carbon atoms, a straight-chain or branched saturated or unsaturated alkoxy group of 1 to 20 carbon atoms, a hydroxyl group, a halogen atom, a nitro group, a cyano group, a trihalomethyl group, a phenyl group, a substituted phenyl group or a —B—$SO_3^-M^+$ group, B is —$(CH_2)_p$—$(O)_q$—$(CH_2)_r$—, p and r are each independently an integer of 0 to 3, q is 0 or 1, and $M^+$ is a hydrogen ion, an alkali metal ion or a quaternary ammonium ion.

[7] The method for improving sensitivity of a resist as stated in [4], wherein the water-soluble conductive polymer compound contains a chemical structure represented by the following formula (3):

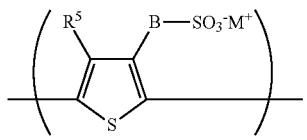

(3)

wherein $R^5$ is a hydrogen atom, a straight-chain or branched saturated or unsaturated hydrocarbon group of 1 to 20 carbon atoms, a straight-chain or branched saturated or unsaturated alkoxy group of 1 to 20 carbon atoms, a hydroxyl group, a halogen atom, a nitro group, a cyano group, a trihalomethyl group, a phenyl group, a substituted phenyl group or a —B—$SO_3^-M^+$ group, B is —$(CH_2)_p$—$(O)_q$—$(CH_2)_r$—, p and r are each independently an integer of 0 to 3, q is 0 or 1, and $M^+$ is a hydrogen ion, an alkali metal ion or a quaternary ammonium ion.

[8] The method for improving sensitivity of a resist as stated in [4], wherein the water-soluble conductive polymer compound contains a chemical structure represented by the following formula (4):

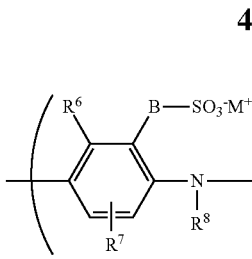

(4)

wherein $R^6$ and $R^7$ are each independently a hydrogen atom, a straight-chain or branched saturated or unsaturated hydrocarbon group of 1 to 20 carbon atoms, a straight-chain or branched saturated or unsaturated alkoxy group of 1 to 20 carbon atoms, a hydroxyl group, a halogen atom, a nitro group, a cyano group, a trihalomethyl group, a phenyl group, a substituted phenyl group or a —B—$SO_3^-M^+$ group, $R^8$ is a monovalent group selected from the group consisting of a hydrogen atom, a straight-chain or branched saturated or unsaturated hydrocarbon group of 1 to 20 carbon atoms, a phenyl group and a substituted phenyl group, B is —$(CH_2)_p$—$(O)_q$—$(CH_2)_r$—, p and r are each independently an integer of 0 to 3, q is 0 or 1, and $M^+$ is a hydrogen ion, an alkali metal ion or a quaternary ammonium ion.

[9] The method for improving sensitivity of a resist as stated in [6], wherein the water-soluble conductive polymer compound is a polymer containing at least one substance selected from a polymer containing 5-sulfoisothianaphthene-1,3-diyl, poly(aniline-2-sulfonic acid) and poly(3-(3-thienyl)propanesulfonic acid).

[10] The method for improving sensitivity of a resist as stated in any one of [1] to [9], wherein the composition containing a water-soluble conductive polymer compound is an antistatic agent.

[11] The method for improving sensitivity of a resist as stated in any one of [1] to [10], wherein the composition containing a water-soluble conductive polymer compound contains the water-soluble conductive polymer compound in an amount of 0.1 to 20% by mass and a solvent in an amount of 80 to 99.9% by mass.

[12] The method for improving sensitivity of a resist as stated in any one of [1] to [11], wherein the hydrosilsesquioxane has a structure represented by $(HSiO_{3/2})_n$, (n is an integer of 3 to 100).

[13] The method for improving sensitivity of a resist as stated in any one of [1] to [12], which is a method to improve sensitivity of a resist when a semiconductor is produced.

[14] The method for improving sensitivity of a resist as stated in any one of [1] to [12], which is a method to improve sensitivity of a resist when a nanoimprint mold is produced.

[15] The method for improving sensitivity of a resist as stated in any one of [1] to [12], which is a method to improve sensitivity of a resist when a reticle is produced.

Advantageous Effects of Invention

According to the method for improving sensitivity of a resist of the present invention, not only sensitivity of a resist formed from hydrosilsesquioxane can be increased to thereby shorten the time for pattern drawing when a pattern is formed in the resist by means of a charged particle beam but also a change of sensitivity with time in the pattern drawing can be inhibited. Moreover, after the step of post-exposure bake (PEB), the water-soluble conductive polymer compound can be removed by washing with water, and therefore, the working steps for forming a pattern can be greatly simplified.

According to the method for improving sensitivity of a resist of the present invention, moreover, lowering of sensitivity of a resist can be prevented in the long-term storage of a resist film. Furthermore, the sensitivity of the resist having been lowered by the long-term storage is recovered.

In the present invention, the expression "improvement in sensitivity of a resist" means that the irradiation dose (exposure dose) of a charged particle beam required to obtain a certain pattern of a resist becomes smaller than the conventional irradiation dose.

DESCRIPTION OF EMBODIMENTS

The present invention is described in detail hereinafter.

The present invention is a method for improving sensitivity of a resist, which is a method to improve sensitivity of a resist formed from hydrosilsesquioxane to a charged particle beam when a pattern is formed in the resist by irradiation with a charged particle beam, and comprises:

prebaking a resist applied onto a substrate and formed from hydrosilsesquioxane, at t° C. ($20 \leq t \leq 300$), applying a composition containing a water-soluble conductive polymer compound to a charged particle beam irradiation surface of the prebaked resist, baking the thus applied composition at T° C. ($0 \leq T < t+40$), and then irradiating the resist with a charged particle beam.

The method for improving sensitivity of a resist of the present invention is applicable to formation of a pattern of a resist formed from hydrosilsesquioxane. Use of the method for improving sensitivity of a resist of the present invention in the formation of a pattern of a resist formed from hydrosilsesquioxane is described below.

The formation of a pattern of a resist using the method for improving sensitivity of a resist of the present invention may comprise a step of applying a resist onto a substrate, a step of prebaking the resist, a step of applying a composition containing a water-soluble conductive polymer compound onto the resist film, a step of baking the composition containing a water-soluble conductive polymer compound, a step of exposure to a charged particle beam, a step of post-exposure bake of the resist film, a step of removing the composition containing a water-soluble conductive polymer compound and a step of developing the resist.

Step of Applying Resist onto Substrate

In the method for improving sensitivity of the present invention, hydrosilsequioxane (HSQ) is used as a resist. The reason is that the hydrosilsesquioxane is suitable for fine processing. To the resist, additives, such as photosensitizer, azide compound, crosslinking agent, dissolution inhibitor and acid generator, may be added. From the viewpoint of control of viscosity of hydrosilsesquioxane (HSQ), the resist preferably contains a solvent. The hydrosilsesquioxane preferably has a structure represented by $(HSiO_{3/2})_n$ (n is an integer of 3 to 100). If n is less than 3, it takes a very long time to cure HSQ as a negative resist by means of a charged particle beam. If n exceeds 100, the molecule size becomes large to thereby impair resolution of the resist.

Application of the resist onto a substrate can be carried out by dropping hydrosilsesquioxane on the substrate and immediately performing a coating method, such as spin coating, roll coating, flow coating, dip coating, spray coating or doctor coating. Examples of the substrates used include compound semiconductor wafers, such as silicon wafer, gallium arsenide wafer and indium phosphorus wafer, quarts substrates, glass substrates, mask blanks, and magnetic substance substrates.

Step of Prebaking Resist

The resist having been applied onto the substrate is prebaked. The prebaking temperature is in the range of 20° C. to 300° C., preferably 20° C. to 200° C., more preferably 20° C. to 60° C., and the prebaking time is in the range of usually 30 seconds to 2 hours. Although the prebaking is usually carried out by heating the resist with a hot plate or an electric oven, it may be carried out by allowing the resist to stand at room temperature or the like.

The thickness of the resist film thus obtained is not specifically restricted and is in the film thickness range in the conventional pattern formation, but it is preferably in the range of 1 nm to 5 μm.

Step of Applying Composition Containing Water-Soluble Conductive Polymer Compound onto Resist Film Application of the composition containing a water-soluble conductive polymer compound onto the resist film can be carried out by dropping the composition containing a water-soluble conductive polymer compound onto the hydrosilsesquioxane and immediately performing a coating method, such as spin coating, roll coating, flow coating, dip coating, spray coating or doctor coating.

(1) Water-Soluble Conductive Polymer Compound

The water-soluble conductive polymer in the present invention is used as a composition containing a solvent together with the water-soluble conductive polymer compound. The composition arbitrarily contains a surface active agent, etc., and usually functions also as an antistatic agent for the resist.

The water-soluble conductive polymer compound for use in the present invention is preferably a π-conjugated conductive polymer compound having a Brønsted acid group or a group that is a salt of Brønsted acid. The water-soluble conductive polymer compound having a Brønsted acid group has only to be a self-doping type conductive polymer wherein a hydrogen atom has been replaced with the Brønsted acid group directly on the π-electron conjugated main chain or replaced with the group through a spacer such as an alkylene side chain or an oxyalkylene side chain, and this compound is not always restricted to a primary structure of the chemical structure. The Brønsted acid d group is preferably a sulfonic acid group. These may be used singly or in combination of two or more kinds.

Examples of the water-soluble conductive polymer compounds include copolymers containing repeating units, such as poly(isothianaphthenesulfonic acid), poly(thiophenealkanesulfonic acid), poly(thiopheneoxyalkanesulfonic acid), poly(pyrrolealkylsulfonic acid) and poly(anilinesulfonic acid), various salt structures of the copolymers, and substituted derivatives of the copolymers.

The copolymer contains repeating units of a sulfonic acid group-containing chemical structure in an amount of usually 100 to 50% by mol, preferably 100 to 80% by mol, of all the repeating units in the copolymer, and the copolymer may be a copolymer containing repeating units of another π-conjugated chemical structure or may be a copolymer containing 2 to 5 kinds of repeating units.

In the present invention, the "copolymer containing repeating units" is not always limited to a copolymer containing the units continuously, and means a copolymer containing repeating units irregularly and discontinuously in the π-conjugated main chain, such as a random copolymer, as long as desired conductivity based on the π-conjugated main chain is exhibited.

Examples of the repeating units containing a sulfonic acid group or a group that is a salt of sulfonic acid in the water-soluble conductive polymer compound include chemical structures represented by the following formulas (1), (2), (3) and (4).

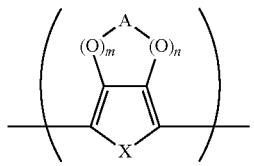
(1)

In the formula (1), m and n are each independently 0 or 1. X is S, N—$R^1$ or O, and $R^1$ is a group selected from the group consisting of a hydrogen atom, a straight-chain or branched saturated or unsaturated monovalent hydrocarbon group of 1 to 20 carbon atoms, a phenyl group and a substituted phenyl group. A is a saturated or unsaturated hydrocarbon group of 1 to 4 carbon atoms (may have two or more double bonds), which has at least one substituent represented by —B—$SO_3^-$ $M^+$ and forms a straight-chain structure together with —$(O)_m$— and —$(O)_n$—. B is —$(CH_2)_p$—$(O)_q$—$(CH_2)_r$—, p and r are each independently an integer of 0 to 3, q is 0 or 1, and $M^+$ is a hydrogen ion, an alkali metal ion or a quaternary ammonium ion.

The saturated or unsaturated hydrocarbon group of 1 to 4 carbon atoms may have a substituent, and as the substituent, there can be mentioned one or more groups selected from a straight-chain or branched saturated or unsaturated hydrocarbon group of 1 to 20 carbon atoms, a straight-chain or branched saturated or unsaturated alkoxy group of 1 to 20 carbon atoms, a hydroxyl group, a halogen atom, a nitro group, a cyano group, a trihalomethyl group, a phenyl group and a substituted phenyl group.

Examples of substituents of the substituted phenyl group represented by $R^2$ and substituents of the above substituted phenyl group include an alkyl group of 1 to 8 carbon atoms, an alkoxy group of 1 to 8 carbon atoms and a halogen atom, and the substituted phenyl group is a phenyl group substituted with 1 to 5 groups selected from these substituents.

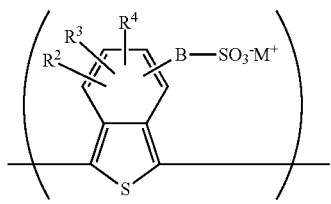
(2)

In the formula (2), $R^2$ to $R^4$ are each independently a hydrogen atom, a straight-chain or branched saturated or unsaturated hydrocarbon group of 1 to 20 carbon atoms, a straight-chain or branched saturated or unsaturated alkoxy group of 1 to 20 carbon atoms, a hydroxyl group, a halogen atom, a nitro group, a cyano group, a trihalomethyl group, a phenyl group, a substituted phenyl group or a —B—$SO_3^-M^+$ group, and B and $M^+$ have the same meanings as above.

Examples of substituents of the substituted phenyl group represented by $R^2$, $R^3$ or $R^4$ include an alkyl group of 1 to 8 carbon atoms, an alkoxy group of 1 to 8 carbon atoms and a halogen atom. Each of $R^2$ to $R^4$ may have plural substituents.

An arbitrary ethylene group in the hydrocarbon group and the alkoxy group represented by $R^2$, $R^3$ and $R^4$ may be replaced with carbonyl group (—CO—), oxy group (—O—), carbonyloxy group (—COO— or —OCO—), aminocarbonyl group (—$NH_2$—CO— or —CO—$NH_2$—), aminosulfonyl group (—$NH_2$—$SO_2$— or —$SO_2$—$NH_2$—), sulfanyl group (—S—), sulfinyl group (—S(O)—), sulfonyl group (—$SO_2$—), sulfonyloxy group (—$SO_2$—O— or —O—$SO_2$—) or imino group (—NH—).

Specific examples of the groups with which ethylene may be replaced include alkylcarbonylalkyl group, alkoxyalkyl group, alkoxyalkoxy group, alkoxycarbonyl group, alkoxycarbonylalkyl group, acyloxy group, acyloxyalkyl group, alkylaminocarbonyl group, alkylaminocarbonylalkyl group, alkylcarbonylamino group, alkylcarbonylaminoalkyl group, alkylaminosulfonyl group, alkylaminosulfonylalkyl group, alkylsulfonylamino group, alkylsulfonylaminoalkyl group, alkylthio group, alkylthioalkyl group, alkylsulfinyl group, alkylsulfinylalkyl group, alkylsulfonyl group, alkylsulfonylalkyl group, alkylsulfonyloxy group, alkylsulfonyloxyalkyl group, alkylamino group, and groups wherein the alkyl portion in the above groups is replaced with a phenyl group which may have a substituent. Examples of the substituents of the phenyl group are the same as the substituents of the substituted phenyl groups represented by $R^2$ to $R^4$.

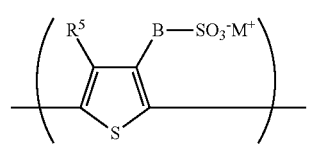
(3)

In the formula (3), $R^5$ has the same meaning as that of $R^2$ to $R^4$, and B and $M^+$ have the same meanings as above.

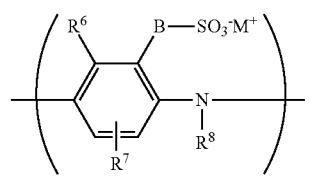
(4)

In the formula (4), each of $R^6$ and $R^7$ independently has the same meaning as that of $R^2$ to $R^4$, and B and $M^+$ have the same meanings as above. $R^8$ is a monovalent group selected from the group consisting of a hydrogen atom, a straight-chain or branched saturated or unsaturated hydrocarbon group of 1 to 20 carbon atoms, a phenyl group and a substituted phenyl group. Examples of substituents of the substituted phenyl group represented by $R^8$ are the same as the substituents of the substituted phenyl groups represented by $R^2$ to $R^4$.

The saturated or unsaturated hydrocarbon group in the definitions of the formula (1) to the formula (4) refers to a group constituted of a carbon atom and a hydrogen atom, and examples of such groups include alkyl group, alkenyl group, alkynyl group, cycloalkyl group, cycloalkenyl group, cycloalkynyl group, aromatic carbon ring, and groups wherein one or plural hydrogen atoms in these groups are replaced with other hydrocarbon groups.

$R^2$ to $R^5$ are each preferably a hydrogen atom, a straight-chain or branched alkyl group of 1 to 20 carbon atoms, or a straight-chain or branched alkoxy group of 1 to 20 carbon atoms, more preferably a hydrogen atom or a straight-chain or branched alkoxy group of 1 to 20 carbon atoms. $R^6$ and $R^7$ are each preferably a hydrogen atom, a straight-chain or branched saturated or unsaturated hydrocarbon group of 1 to 20 carbon atoms, a phenyl group or a substituted phenyl group.

Particularly preferred examples of $R^2$ to $R^7$ include hydrogen atom, alkyl group, alkenyl group, alkoxy group, alkoxyalkyl group, carbonyl group-containing group, alkoxyalkoxy group, alkoxycarbonyl group, acyloxy group, phenyl group and substituted phenyl group. Specific examples of these substituents include alkyl groups, such as methyl group, ethyl group, propyl group, allyl group, isopropyl group, butyl group, pentyl group, hexyl group, heptyl group, octyl group, nonyl group, decyl group, undecyl group, dodecyl group, tetradecyl group and hexadecyl group; alkenyl groups, such as vinyl group, 1-propenyl group and 1-butenyl group; alkoxyalkyl groups, such as ethoxyethyl group, methoxyethyl group and methoxyethoxylethyl group; carbonyl group-containing groups, such as acetonitrile group and phenacyl group; alkoxy groups, such as methoxy group, ethoxy group, propoxy group, isopropoxy group, butoxy group, pentyloxy group, hexyloxy group, octyloxy group and dodecyloxy group; alkoxyalkoxy groups, such as methoxyethoxy group and methoxyethoxyethoxy group; alkoxycarbonyl groups, such as methoxycarbonyl group, ethoxycarbonyl group and butoxycarbonyl group; acyloxy groups, such as acetoxy group and butyroyloxy group; and phenyl groups which may have substituents (e.g., halogen atom, alkyl group and alkoxy group), such as phenyl group, fluorophenyl group, chlorophenyl group, bromophenyl group, methylphenyl group and methoxyphenyl group.

Preferred examples of B in the formulas (1) to (4) include single bond, methylene, ethylene, propylene, butylene, pentylene, hexylene, oxymethylene, oxyethylene, oxypropylene, methyleneoxyethylene and ethyleneoxyethylene. Particularly preferred examples of B include single bond, ethylene, propylene, oxyethylene and ethyleneoxyethylene.

As for the cation represented by $M^+$, two or more kinds of cations may be present.

Examples of the alkali metal ions include $Na^+$, $Li^+$ and $K^+$.

The quaternary ammonium ion is represented by $N(R^9)(R^{10})(R^{11})(R^{12})^+$. $R^9$ to $R^{12}$ are each independently a hydrogen atom, a straight-chain or branched substituted or unsubstituted alkyl group of 1 to 30 carbon atoms, or a substituted or unsubstituted aryl group, and may be an alkyl group or an aryl group containing a group having an element other than carbon and hydrogen, such as alkoxy group, hydroxyl group, oxyalkylene group, thioalkylene group, azo group, azobenzene group or p-phenyleneoxy group.

As the quaternary ammonium ion, an unsubstituted or alkyl-substituted or aryl-substituted cation, such as $Na_4^+$, $NH(CH_3)_3^+$, $NH(C_6H_5)_3^+$ or $N(CH_3)_2(CH_2OH)(CH_2-Z)$ (Z is an arbitrary substituent having chemical formula quantity of not more than 600 and is, for example, phenoxy group, p-diphenyleneoxy group, p-alkoxydiphenyleneoxy group or p-alkoxyphenylazophenoxy group) is used. For conversion into an arbitrary cation, a usual ion-exchange resin can be used.

An arbitrary ethylene group in the alkyl group of $R^9$ to $R^{12}$ may be replaced with carbonyl group (—CO—) oxy group (—O—) carbonyloxy group (—COO— or —OCO—) aminocarbonyl group (—NH$_2$—CO— or —CO—NH$_2$—) aminosulfonyl group (—NH$_2$—SO$_2$— or —SO$_2$—NH$_2$—) sulfanyl group (—S—) sulfinyl group (—S(O)—) sulfonyl group (—SO$_2$—) sulfonyloxy group (—SO$_2$—O— or —O—SO$_2$—) or imino group (—NH—).

Preferred examples of the chemical structures represented by the formula (1), (2) or (3) include 5-(3'-propanesulfo)-4,7-dioxycyclohexa[2,3-c]thiophene-1,3-diyl, 5-(2'-ethanesulfo)-4,7-dioxycyclohexa[2,3-c]thiophene-1,3-diyl, 5-sulfoisothianaphthene-1,3-diyl, 4-sulfoisothianaphthene-1,3-diyl, 4-methyl-5-sulfoisothianaphthene-1,3-diyl, 6-methyl-5-sulfoisothianaphthene-1,3-diyl, 6-methyl-4-sulfoisothianaphthene-1,3-diyl, 5-methyl-4-sulfoisothianaphthene-1,3-diyl, 6-ethyl-5-sulfoisothianaphthene-1,3-diyl, 6-propyl-5-sulfoisothianaphthene-1,3-diyl, 6-butyl-5-sulfoisothianaphthene-1,3-diyl, 6-hexyl-5-sulfoisothianaphthene-1,3-diyl, 6-decyl-5-sulfoisothianaphthene-1,3-diyl, 6-methoxy-5-sulfoisothianaphthene-1,3-diyl, 6-ethoxy-5-sulfoisothianaphthene-1,3-diyl, 6-chloro-5-sulfoisothianaphthene-1,3-diyl, 6-bromo-5-sulfoisothianaphthene-1,3-diyl, 6-trifluoromethyl-5-sulfoisothianaphthene-1,3-diyl, 5-(sulfomethane)isothianaphthene-1,3-diyl, 5-(2'-sulfoethane)isothianaphthene-1,3-diyl, 5-(2'-sulfoethoxy)isothianaphthene-1,3-diyl, 5-(2'-(2''-sulfoethoxy)methane)isothianaphthene-1,3-diyl, 5-(2'-(2''-sulfoethoxy)ethane)isothianaphthene-1,3-diyl, and lithium salts, sodium salts, ammonium salts, methylammonium salts, ethylammonium salts, dimethylammonium salts, diethylammonium salts, trimethylammonium salts, triethylammonium salts, tetramethylammonium salts and tetraethylammonium salts of the above compounds.

Preferred examples of the chemical structures represented by the formula (4) include 2-sulfo-1,4-iminophenylene, 3-methyl-2-sulfo-1,4-iminophenylene, 5-methyl-2-sulfo-1,4-iminophenylene, 6-methyl-2-sulfo-1,4-iminophenylene, 5-ethyl-2-sulfo-1,4-iminophenylene, 5-hexyl-2-sulfo-1,4-iminophenylene, 3-methoxy-2-sulfo-1,4-iminophenylene, 5-methoxy-2-sulfo-1,4-iminophenylene, 6-methoxy-2-sulfo-1,4-iminophenylene, 5-ethoxy-2-sulfo-1,4-iminophenylene, 2-sulfo-N-methyl-1,4-iminophenylene, 2-sulfo-N-ethyl-1,4-iminophenylene, and lithium salts, sodium salts, ammonium salts, methylammonium salts, ethylammonium salts, dimethylammonium salts, diethylammonium salts, trimethylammonium salts, triethylammonium salts, tetramethylammonium salts and tetraethylammonium salts of the above compounds.

Examples of the water-soluble conductive polymer compounds having repeating units other than the repeating units of the above formulas (1) to (4), which can be used in the present invention, include poly(carbazole-N-alkanesulfonic acid), poly(phenylene-oxyalkanesulfonic acid), poly(phenylenevinylene-alkanesulfonic acid), poly(phenylenevinylene-oxyalkanesulfonic acid), poly(aniline-N-alkanesulfonic acid), poly(thiophenealkylcarboxylic acid), poly(thiopheneoxyalkylcarboxylic acid), poly(polypyrrolealkylcarboxylic acid), poly(pyrroleoxyalkylcarboxylic acid), poly(carbazole-N-alkylcarboxylic acid), poly(phenylene-oxyalkylcarboxylic acid), poly(phenylenevinylene-alkylcarboxylic acid), poly(phenylenevinylene-oxyalkylcarboxylic acid), poly(aniline-N-alkylcarboxylic acid), poly(aniline-2-sulfonic acid), poly(3-(3-thienyl)propanesulfonic acid), substituted derivatives of these compounds, 6-sulfonato[2,3-c]thiophene-1,3-diyl, and lithium salts, sodium salts, ammonium salts, methylammonium salts, ethylammonium salts, dimethylammonium salts, diethylammonium salts, trimethylammonium salts, triethylammonium salts, tetramethylammonium salts and tetraethylammonium salts of the above compounds.

The molecular weight of the water-soluble conductive polymer compound is in the range of 5 to 2000, preferably 10 to 1000, in terms of the number of repeating units to constitute the main chain (degree of polymerization).

Particularly preferred examples of the water-soluble conductive polymer compounds include a polymer of 5-sulfoisothianaphthene-1,3-diyl, a random copolymer containing not less than 80% by mol of 5-sulfoisothianaphthene-1,3-diyl, a copolymer of 5-sulfoisothianaphthene-1,3-diyl and isothianaphthene-1,3-diyl, poly(3-(3-thienyl)ethanesulfonic acid), poly(aniline-2-sulfonic acid), poly(3-(3-thienyl)propanesulfonic acid), poly(2-(3-thienyl)oxyethanesulfonic acid), a random copolymer containing not less than 50% by mol of 2-sulfo-1,4-iminophenylene, a copolymer of 2-sulfo-1,4-iminophenylene and 1,4-iminophenylene, and lithium salts, sodium salts, ammonium salts and triethylammonium salts of these polymers.

Process for Preparing Water-Soluble Conductive Polymer Compound

The water-soluble conductive polymer compound can be prepared by the methods described in Japanese Patent Laid-Open Publication No. 48436/1995, Synthetic Metals, Vol. 30, sec. 305-319, 1989, Japanese Patent Laid-Open Publication No. 189333/1990 and International Publication WO98/03499 pamphlet.

(2) Solvent

The composition containing a water-soluble conductive compound for use in the present invention is used by dissolving it in water. A solvent which is compatible with water and dissolves the self-doping type conductive polymer without dedoping it may be used. Examples of such solvents include ethers, such as 1,4-dioxane and tetrahydrofuran; carbonates, such as dimethyl carbonate, diethyl carbonate, ethylene carbonate and propylene carbonate; nitriles, such as acetonitrile and benzonitrile; alcohols, such as methanol, ethanol, propanol and isopropanol; aprotic polar solvents, such as N,N-dimethylformamide, dimethyl sulfoxide and N-methyl-2-pyrrolidone; mineral acids, such as sulfuric acid; and organic acids, such as acetic acid. These solvents may be used singly or in combination of two or more kinds.

(3) Blending Quantity

The composition containing a water-soluble conductive polymer compound for use in the present invention preferably contains the water-soluble conductive polymer compound in an amount of 0.1 to 20% by mass and the solvent in an amount of 80 to 99.9% by mass, and the composition more preferably contains the water-soluble conductive polymer compound in an amount of 0.2 to 5% by mass and the solvent in an amount of 95 to 99.8% by mass. If the amount of the water-soluble conductive polymer compound is less than 0.1% by mass, antistatic performance is not exhibited and the effect of the present invention is not obtained. If the amount thereof exceeds 20% by mass, fluidity of the composition is lowered to thereby make coating operation difficult.

(4) Arbitrary Components

The composition containing a water-soluble conductive polymer compound for use in the present invention may contain, in addition to the water-soluble conductive polymer compound and the solvent, a surface active agent in order to improve application properties of the composition onto the resist. The surface active agent employable in the present invention is not specifically restricted provided that it is a compound exerting surface activity effect, and the surface active agent may be any of an anionic surface active agent, a cationic surface active agent, an amphoteric surface active agent and a nonionic surface active agent.

Examples of the anionic surface active agents include alkylether carboxylic acid, straight-chain alkylbenzenesulfonic acid, $\alpha$-olefinsulfonic acid, alkanesulfonate, dialkylsulfosuccinic acid, naphthalenesulfonic acid formaldehyde condensate, alkylsulfuric acid ester, polyoxyethylene alkyl ether sulfuric acid ester, polyoxyethylene alkylphenyl ether sulfuric acid ester, higher alcohol phosphoric acid ester, higher alcohol ethylene oxide adduct phosphoric acid ester and acyl-N-methyltaurine. Salts of these compounds are also employable.

Examples of the cationic surface active agents include monoalkylammonium, dialkylammonium, ethoxidized ammonium, quaternary amine and alkylaminoacetic acid. Salts of these compounds are also employable.

Examples of the amphoteric surface active agents include lauryldimethylaminoacetic acid betaine, stearyldimethylaminoacetic acid betaine, lauryldimethylamine oxide, 2-alkyl-N-carboxymethyl-N-hydroxyethylimidazolinium betaine, lauric acid amide propyl betaine, lauryl hydroxysulfobetaine and alanines. Salts of these compounds are also employable.

Examples of the nonionic surface active agents include glycerol fatty acid ester, propylene glycol fatty acid ester, sorbitan fatty acid ester, sucrose fatty acid ester, polyethylene glycol fatty acid ester, polyoxyethylene alkyl ether, alkyl glyceryl ether, polyoxyethylene alkyl phenyl ether, polyoxyethylene polyoxypropylene ether, polyoxyalkylene alkyl ether, acetylene glycol, polyoxyethylene sorbitan fatty acid ester, polyoxyethylene sorbitol fatty acid ester, alkyl glyceryl ether, fatty acid alkylene oxide adduct, polyoxyethylene hardened castor oil, fatty acid alkanol amide, fatty acid amide alkylene oxide adduct, amine EO adduct and amine PO adduct.

These surface active agents can be used singly or as a mixture of two or more kinds. It is preferable to use at least one surface active agent selected from the anionic surface active agents and the amphoteric surface active agents. Moreover, the amphoteric surface active agent, the nonionic surface active agent, the cationic surface active agent or a compound having surface activity effect, such as a water-soluble polymer, may be mixed.

The amount of the surface active agent added to the composition is in the range of preferably 0.0001 to 10% by mass based on 100% by mass of the whole composition containing the surface active agent. If the amount added is over 10% by mass, conductivity of the conductive film is liable to be lowered. If the amount added is less than 0.0001% by mass, surface activity effect cannot be expected.

The composition may contain a neutralizing agent and a water-soluble polymer in addition to the above compounds. As the neutralizing agent, a compound represented by $M^+$-$OH^-$ ($M^+$ has the same meaning as previously described and is a hydrogen ion, an alkali metal ion or a quaternary ammonium ion) can be used for neutralizing Brønsted acid of the water-soluble conductive polymer compound and other additives contained in the solution. Moreover, an amine compound wherein one or more hydrogen atoms of ammonia have been replaced with hydrocarbon residual groups can be used. The amine compound refers to aliphatic amine wherein the hydrocarbon residual group is an alkyl group or a substituted group thereof or aromatic amine wherein all or a part of the hydrocarbon residual groups are aromatic hydrocarbon residual groups, and also refers to monoamine having, in one molecule, one nitrogen atom of an amino group or an imino group or polyamine containing plural amino groups, such as diamine.

Although the water-soluble polymer which may be contained in the composition is not specifically restricted, examples of the water-soluble polymers include polyethylene glycol distearate, polyethylene oxide, polyvinyl alcohol, polyvinyl pyrrolidone, polyvinyl caprolactum, polyvinyl alkyl ether, N-vinylacetamide, carboxyvinyl polymer, sodium polyacrylate, carboxymethyl cellulose, NH4-CMC (carboxymethyl cellulose ammonium), hydroxyethyl cellulose, hydroxypropylmethyl cellulose, hydroxypropyl cellulose, hydroxyethyl cellulose sodium, hydroxypropyl stearyl ether, hydroxypropyl sulfonate, cationized cellulose, VEMA (methoxyethylene/maleic anhydride copolymer), micro-fibrous cellulose, xanthan gum, alginic acid, gelatin, cyclodexatrin, gum arabic, veegum, starch, viscosity index improver for oils (macchann), gelling agent, carrageenan, consistency-strengthened cellulose ether, delayed solubility cellulose ether, locust bean gum, associative polyurethane-based thickening agent and protein hydrolyzate.

(5) Preparation Process

The composition containing a water-soluble conductive polymer compound for use in the present invention can be prepared by dissolving the water-soluble polymer compound in a solvent preferably with stirring the solvent at room temperature.

pH of the composition containing a water-soluble conductive polymer compound can be arbitrarily controlled between acidity and alkalinity by changing the amount of the above neutralizing agent added.

pH of the composition containing a water-soluble conductive polymer compound is in the range of preferably 2 to 9, more preferably 3 to 8.

(6) Application of Composition Containing Water-Soluble Conductive Polymer Compound to Irradiation Surface of Resist For applying the composition containing a water-soluble conductive polymer compound to a charged particle beam irradiation surface of the resist, spin coating is preferable, but other methods, such as dipping (dip coating), spraying and bar coater method, may be used.

The sensitivity of a resist film has been lowered with time in the past.

On the other hand, by applying the composition onto a resist film at the relatively earlier time after prebaking of the resist, lowering of the sensitivity of the resist film can be prevented. Application of the composition is carried out after prebaking of the resist, preferably within 2 hours after the prebaking.

Even in the case of a resist film the sensitivity of which has been lowered by long-term storage, the sensitivity of the resist film can be recovered by applying the composition onto the resist film. In this case, application of the composition may be carried out after the lapse of, for example, 2 hours from the preparation of the resist film, and is carried out preferably within 5 years, more preferably within 3 months, after the preparation of the resist film.

Step Of Baking Composition Containing Water-Soluble Conductive Polymer Compound

Next, the composition containing a water-soluble conductive polymer compound is baked. Actually, the resist on which the composition containing a water-soluble conductive polymer compound has been applied and the substrate on which the resist has been laminated are baked together with the composition containing a water-soluble conductive polymer compound. The baking is carried out at a temperature of T° C. satisfying the following formula (I), more preferably at a temperature of T° C. satisfying the following formula (II), for usually 30 seconds to 30 minutes. Although the baking is usually carried out by heating the composition with a hot plate or an electric oven, it may be carried out by allowing the composition to stand at room temperature or the like.

$$0°C. \leq T < t + 40°C. \tag{I}$$

$$0°C. \leq T \leq t \tag{II}$$

In the above formula (I), t(° C.) is a temperature of the prebaking.

The thickness of the film of the composition after baking is preferably not less than 1 nm but not more than 5 μm, more preferably 2 nm to 50 nm, still more preferably 5 nm to 30 nm. When the film thickness is in the above range, satisfactory antistatic performance can be exhibited, and besides, loss of electron beam energy due to increase of screening effect of the coating film of the composition is small.

From the viewpoint of lowering of sensitivity of the resist film with time, irradiation with a charged particle beam that is a subsequent step to the baking step is preferably carried out immediately after the baking. However, even if the irradiation is carried out after long-term storage, the effect of preventing lowering of sensitivity of the resist can be obtained. In this case, irradiation with a charged particle beam may be carried out after the lapse of, for example, 2 hours or more from the baking, and it is carried out preferably within 5 years, more preferably within 3 months, after the baking.

Step of Exposure to Charged Particle Beam

Drawing of a pattern in the resist is carried out by directly irradiating the resist with a charged particle beam. Examples of methods for irradiation with a charged particle beam include irradiation of point beam type or variable shaped beam type, multi-beam irradiation and irradiation of projection type. Irradiation with a charged particle beam may be carried out by setting a blanking device on a scanning electron microscope. The exposure dose is not specifically restricted, but for example, when an acceleration voltage of 100 kV is used, an exposure dose of 500 to 4000 μC/cm$^2$ is preferable. When a pattern with a size having a line width of not more than 50 nm is formed and an acceleration voltage of 100 kV is used, an exposure dose of 1800 to 24000 μC/cm$^2$ is preferable. The exposure dose may be appropriately changed according to change of the acceleration voltage or depending upon the pattern shape.

Although the charged particle beam used in the method for improving sensitivity of the present invention is not specifically restricted, an electron beam or an ion beam is preferable.

Step of Post-Exposure Bake (PEB) of Resist Film

After the exposure, the resist and the substrate on which the composition containing a water-soluble conductive polymer compound has been laminated may be subjected to post-exposure bake (PEB)

Step of Removing Composition Containing Water-Soluble Conductive Polymer Compound After the irradiation with a charged particle beam, the composition containing a water-soluble conductive compound can be removed by washing it with water. The removal by water washing may be carried out after the PEB step. The water washing method is, for example, a method comprising dropping ultrapure water on a surface of the composition containing a water-soluble conductive polymer compound, allowing them to stand still for 15 seconds to 10 minutes and then removing the composition containing a water-soluble conductive polymer compound which has been dissolved in the ultrapure water, by the use of a spin coater.

Step Of Developing Resist

In the step of developing the resist, tetramethylammonium hydroxide (TMAH, aqueous solution of not less than 2.38%)

or a solution obtained by diluting the TMAH with water in an arbitrary proportion is usually used as a developing solution. The resist is immersed in the developing solution at a temperature of 17° C. to 60° C. for 1 minute to 60 minutes, and then the unexposed portion is washed away with running pure water for 2 minutes to 5 minutes.

Effects

According to the method for improving sensitivity of a resist of the present invention, it is possible to draw a pattern in a resist formed from hydrosilsesquioxane in a charged particle beam irradiation dose that is smaller than the conventional irradiation dose.

The reason why the sensitivity of a resist pattern drawn by an electron beam is improved by applying the composition containing a water-soluble conductive polymer compound onto a resist film formed from hydrosilsesquioxane in the present invention is thought to be that hydrosilsesquioxane has characteristics that bonding is liable to be undone by the influence of heat generated by the electron beam irradiation, but the water-soluble conductive polymer compound functions to reduce the influence of heat generated in the electron beam irradiation to thereby inhibit decomposition of HSQ.

Moreover, it becomes possible to prevent or recover lowering of sensitivity of a resist formed from hydrosilsesquioxane due to long-term storage of the resist.

More specifically, when the step of applying the composition containing a water-soluble conductive polymer compound onto the resist film and the baking step are carried out before storage of the resist, that is, when these steps are carried out after the lapse of 30 seconds to 2 hours from the preparation of the resist film and then the resist is stored, it becomes possible to prevent lowering of sensitivity due to storage of the resist formed from hydrosilsesquioxane. The degree of prevention is as follows. On the basis of a sensitivity given when the resist is stored without applying the composition onto the resist, the sensitivity ratio can be increased to 1.04 to 1.11. The sensitivity ratio can be determined by the following formula, similarly to the definition in the later-described examples. The exposure dose in the following formula is an exposure dose of an electron beam required to obtain a pattern having a line width of about 20 nm.

Sensitivity ratio=Exposure quantity required when resist is stored without applying composition/Exposure quantity required when resist is stored after composition is applied onto resist and baked On the other hand, when the step of applying the composition containing a water-soluble conductive polymer compound onto the resist film and the baking step are carried out after storage of the resist, that is, when these steps are carried out after the lapse of 2 hours from the preparation of the resist film, preferably after the lapse of 2 hours to 5 years from the preparation of the resist film, it is possible to recover lowering of sensitivity due to storage of the resist formed from hydrosilsesquioxane. The degree of recovery is as follows. As compared with the case where the resist is stored without applying the composition onto the resist, the sensitivity ratio can be increased to 1.07. The sensitivity ratio can be determined by the following formula, similarly to the definition in the later-described examples. The exposure dose in the following formula is an exposure dose of an electron beam required to obtain a pattern having a line width of about 20 nm.

Sensitivity ratio=Exposure quantity required when resist is stored without applying composition/Exposure quantity required when composition is applied onto resist having been stored and then baked The storage conditions in the long-term storage are as follows. The resist may be stored in the atmosphere, may be stored in a charged particle beam irradiation device, or may be stored in a charged particle beam irradiation room of a charged particle beam irradiation device, from which the atmospheric air has been exhausted. The storage period is preferably not longer than 5 years from the viewpoint of reactivity of the resist.

Furthermore, it is possible to inhibit a change of sensitivity of the resist formed from hydrosilsesquioxane with time under vacuum. The sensitivity of the resist formed from hydrosilsesquioxane is lowered with the lapse of time after the beginning of placement of the resist in the charged particle beam exposure device, but according to the method for improving sensitivity of a resist of the present invention, such a change with time can be inhibited.

Use Application

The method for improving sensitivity of a resist of the present invention can be utilized for forming a circuit pattern by irradiating a semiconductor surface with a charged particle beam through a resist. When the method for improving sensitivity of a resist of the present invention is utilized, a pattern of high line width uniformity can be formed on the semiconductor surface in a short period of time.

As a semiconductor production process, there can be mentioned a conventional production process such as a semiconductor production process comprising diffusion step, CVD step, pattern formation step, etching step, sputtering step, etc., which is described in, for example, a literature "Newest Tendency of Resist for Electronics" (Toray Research Center), and in the preparation of a mask used in the above pattern formation step, the method for improving sensitivity of the present invention is used.

Also in a pattern formation step wherein drawing is carried out directly on a semiconductor substrate without using a mask, the method for improving sensitivity of the present invention can be used.

Moreover, the method for improving sensitivity of a resist of the present invention can be utilized for producing a nanoimprint mold by irradiating a surface of a substrate made of Si, SiC, $SiO_2$, Ta or the like with a charged particle beam through a resist. When a nanoimprint mold is produced utilizing the method for improving sensitivity of a resist of the present invention, high-speed formation of a pattern having high line width uniformity becomes possible.

As a nanoimprint mold production process, there can be mentioned a nanoimprint mold production process described in, for example, a literature "Photomask and Next Generation Lithography Mask Technology X II" (Proc. of SPIE, Vol. 58 53, p. 277).

Furthermore, the method for improving sensitivity of a resist of the present invention can be utilized for producing a reticle by irradiating a surface of a mask blank made of quartz or a substrate having purity corresponding to that of quartz with a charged particle beam through a resist. When a reticle is produced utilizing the method for improving sensitivity of a resist of the present invention, high-speed formation of a pattern having high line width uniformity becomes possible.

As a reticle production process, there can be mentioned a reticle production process described in, for example, a literature "Detectability and printability of EUVL mask blank defects for 32 nm hp node" (http://www.osti.gov/bridge/servlets/purl/918124-unRCSF).

Sensitivity Improver for Resist

The composition containing a water-soluble conductive polymer for use in the present invention can be also used as a sensitivity improver for a resist formed from hydrosilsesquioxane.

The sensitivity improver for a resist is applied to an irradiation surface of an electron beam-sensitive resist when a pattern is drawn in the resist by means of a charged particle beam, whereby sensitivity of the resist is improved. Moreover, by applying the sensitivity improver onto a resist, sensitivity of the resist is not lowered even after long-term storage of the resist. Furthermore, by applying the sensitivity improver onto a resist having been stored for a long period of time, sensitivity of the resist is improved.

EXAMPLES

The present invention is further described with reference to the following examples, but it should be construed that the present invention is in no way limited to those examples.

Synthesis Example

Poly(5-sulfoisothianaphthene-1,3-diyl) (SDPITN) was synthesized and purified referring to the method described in Japanese Patent Laid-Open Publication No. 48436/1995. The resulting water-soluble conductive polymer was a polymer having a sulfonic acid substituted compound ratio, as determined by neutralization titration with alkali, of almost 100% by mol (molar fraction: 1.0). The number-average molecular weight of the polymer, as measured by GPC, was 18000 (in terms of sodium polystyrene sulfonate).

Using the resulting poly(5-sulfoisothianaphthene-1,3-diyl), an aqueous solution of 0.1% by weight was prepared, and an operation to concentrate the solution to 1% by weight by the use of Millipore Pelicon XL (membrane type Biomax-10) was repeated 5 times to perform purification.

Poly(aniline-2-sulfonic acid) (SDPAn) was synthesized referring to J. Am. Chem. Soc., 112, p. 2800 (1990). The weight-average molecular weight of this compound, as measured by GPC, was 20000 (in terms of pullulan).

Using the resulting poly(aniline-2-sulfonic acid), an aqueous solution of 0.1% by weight was prepared, and an operation to concentrate the solution to 1% by weight by the use of Millipore Pelicon XL (membrane type Biomax-10) was repeated 5 times to perform purification.

Poly(3-(3-thienyl)propanesulfonic acid) (SDPT) was synthesized by the use of the method described in *Polymer Preprints, Japan*, Vol. 39, p. 561 (1990). The weight-average molecular weight of this compound, as measured by GPC, was 100000 (in terms of pullulan).

Using the resulting poly(3-(3-thienyl)propanesulfonic acid), an aqueous solution of 0.1% by weight was prepared, and an operation to concentrate the solution to 1% by weight by the use of Millipore Pelicon XL (membrane type Biomax-10) was repeated 5 times to perform purification.

Preparation of Composition Containing Water-Soluble Conductive Polymer Compound

Composition 1

In 95 parts by mass of water, 1.0 part by mass of SDPITN, 0.1 part by mass of straight-chain alkylbenzenesulfonic acid (Neopelex GS available from Kao Corporation, sometimes abbreviated to ABS) and 0.1 part by mass of polyethylene oxide (PEO available from Sigma-Aldrich Corporation, molecular weight: 900,000) were dissolved, and to the solution was added hexamethylenediamine (1,6-hexanediamine available from Kanto Chemical Co., Ltd.) so that the content thereof would become 1.0 mmol/l. By the use of 1N aqueous ammonia (available from Kanto Chemical Co., Ltd.), pH of the whole solution was adjusted to 5, and then water was further added to obtain 100 parts by mass (total amount) of a composition 1.

Composition 2

In 95 parts by mass of water, 1.0 part by mass of SDPITN, 0.1 part by mass of straight-chain alkylbenzenesulfonic acid (Neopelex GS available from Kao Corporation), 0.1 part by mass of polyethylene oxide (PEO available from Sigma-Aldrich Corporation, molecular weight: 900,000) and 0.2 part by mass of W42SP (hydrolyzed collagen available from Seiwa Kasei Co., Ltd.) were dissolved, and to the solution was added hexamethylenediamine so that the content thereof would become 1.0 mmol/l. By the use of 1N aqueous ammonia, pH of the whole solution was adjusted to 5, and then water was further added to obtain 100 parts by mass (total amount) of a composition 2.

Composition 3

In 95 parts by mass of water, 1.0 part by mass of SDPITN and 0.1 part by mass of straight-chain alkylbenzenesulfonic acid (Neopelex GS available from Kao Corporation) were dissolved, and to the solution was added hexamethylenediamine so that the content thereof would become 1.0 mmol/l. By the use of 1N aqueous ammonia, pH of the whole solution was adjusted to 4, and then water was further added to obtain 100 parts by mass (total amount) of a composition 3.

Composition 4

In 95 parts by mass of water, 1.0 part by mass of SDPAn and 0.1 part by mass of straight-chain alkylbenzenesulfonic acid (Neopelex GS available from Kao Corporation) were dissolved, and to the solution was added hexamethylenediamine so that the content thereof would become 1.0 mmol/l. By the use of 1N aqueous ammonia, pH of the whole solution was adjusted to 4, and then water was further added to obtain 100 parts by mass (total amount) of a composition 4.

Composition 5

In 95 parts by mass of water, 1.0 part by mass of SDPT and 0.1 part by mass of straight-chain alkylbenzenesulfonic acid (Neopelex GS available from Kao Corporation) were dissolved, and to the solution was added hexamethylenediamine so that the content thereof would become 1.0 mmol/l. By the use of 1N aqueous ammonia, pH of the whole solution was adjusted to 4, and then water was further added to obtain 100 parts by mass (total amount) of a composition 5.

Composition 6

In 95 parts by mass of water, 0.1 part by mass of straight-chain alkylbenzenesulfonic acid (Neopelex GS available from Kao Corporation) and 0.1 part by mass of polyethylene oxide (PEO available from Sigma-Aldrich Corporation, molecular weight: 900,000) were dissolved, and to the solution was added hexamethylenediamine so that the content thereof would become 1.0 mmol/l. By the use of 1N aqueous ammonia, pH of the whole solution was adjusted to 5, and then water was further added to obtain 100 parts by mass (total amount) of a composition 6.

Example 1

On a 75 mm silicon wafer (available from Mitsubishi Materials Corporation), 1.5 ml of a HSQ resist (structure: $(HSiO_{3/2})_n$, Fox-12 available from Dow Corning Corporation) wherein HSQ had been diluted with methyl isobutyl ketone (MIBK) so that the volume ratio would become 1:2 (HSQ:MIBK) was dropped, and spin coating of 2000 revolutions for 60 seconds by the use of a spin coater (manufactured by MIKASA Co., Ltd.) was carried out to perform film formation.

After the film formation, the substrate coated with the HSQ resist was prebaked on a hot plate (manufactured by Iuchi Seieido Co., Ltd.) at 40° C. for 4 minutes.

On the HSQ resist film thus baked, 1.5 ml of the composition 1 of the present example was dropped, and spin coating of 2000 revolutions for 60 seconds (spin coater: manufactured by MIKASA Co., Ltd.) was carried out, and then baking was carried out by a hot plate at 40° C. for 90 seconds to prepare a coating film (film thickness: 15 nm) of the composition 1. Thus, a specimen was obtained.

Surface resistance and film thickness of the resulting specimen were measured in the following manner. Further, the specimen was irradiated with an electron beam under the following conditions to measure sensitivity ratio and sensitivity ratio after the lapse of time. The results are set forth in Table 1.

Method for Measuring Surface Resistance

The coating film formed from the composition by a spin coater as above was allowed to stand for 30 minutes at room temperature, and then surface resistance was measured by the use of a surface resistance measuring device Megaresta MODEL HT-301 (manufactured by Shishido Electrostatic, Ltd.).

Method for Measuring Thickness of Coating Film of Composition

The thickness of the resist and the thickness of the coating film of the composition were measured by Surfcom 900A (manufactured by Tokyo Seimitsu Co., Ltd.).

Method for Measuring Sensitivity Ratio and Sensitivity Ratio after Lapse of Time Immediately after the preparation of the coating film of the composition, the HSQ thin film of 30 nm thickness prepared in Example 1 was irradiated with an electron beam at an acceleration voltage of 100 kV and an irradiation current of 0.6 nA in an arbitrary exposure dose using an electron beam exposure device of JBX-9300FS model manufactured by JEOL Ltd. so that a pattern having a line width of about 20 nm might be formed.

The specimen having been exposed to an electron beam was immersed in running deionized water for 2 minutes to remove the composition. After excess water was removed from the resist by dry air, the specimen was immersed in a 2.38% aqueous solution of tetramethylammonium hydroxide (abbreviated to TMAH hereinafter) at 23° C. for 2 minutes and subsequently immersed in running deionized water for 5 minutes to perform water washing, whereby a resist pattern was obtained.

A minimum exposure dose of an electron beam required to obtain a pattern having a line width of about 20 nm in the case where no composition was applied (Comparative Example 1) was taken as a reference exposure dose, and a reciprocal number of a ratio of an exposure dose required to obtain a pattern having a line width of about 20 nm in the specimen obtained in Example 1 to the reference exposure dose was defined as a sensitivity ratio.

The sensitivity ratio after the lapse of time was determined in the following manner. A sensitivity ratio was obtained in the same manner as in the above measurement of a sensitivity ratio, except that irradiation with an electron beam was carried out after the lapse of 4 hours or more since the specimen was placed in the exposure device after the preparation of the coating film of the composition. The thus obtained sensitivity ratio was defined as a sensitivity ratio after the lapse of time.

Examples 2 to 5

Surface resistivity, sensitivity ratio and sensitivity ratio after the lapse of time were determined by carrying out the same operations as in Example 1, except that the composition 1 was replaced with each of the compositions 2 to 5. The results are set forth in Table 1.

Example 6

Surface resistivity, sensitivity ratio and sensitivity ratio after the lapse of time were determined by carrying out the same operations as in Example 1, except that the irradiation current in the electron beam irradiation was changed to 10 nA, and the prebaking temperature after the application of HSQ and the baking temperature after the application of the composition containing a water-soluble conductive polymer compound were each changed to 200° C.

Comparative Example 1

Surface resistivity, sensitivity ratio and sensitivity ratio after the lapse of time were determined by carrying out the same operations as in Example 1, except that the composition 1 was not used. The results are set forth in Table 1.

Comparative Example 2

Surface resistivity, sensitivity ratio and sensitivity ratio after the lapse of time were determined by carrying out the same operations as in Example 1, except that the composition 1 was replaced with the composition 6. The results are set forth in Table 1.

Comparative Example 3

Surface resistivity, sensitivity ratio and sensitivity ratio after the lapse of time were determined by carrying out the same operations as in Example 1, except that the substrate on which the HSQ resist film had been arranged was prebaked at 360° C. for 4 minutes. The results are set forth in Table 1.

Comparative Example 4

Surface resistivity, sensitivity ratio and sensitivity ratio after the lapse of time were determined by carrying out the same operations as in Example 1, except that the substrate on which the HSQ resist film had been arranged was prebaked at 360° C. for 90 seconds. The results are set forth in Table 1.

Example 7

On a 75 mm silicon wafer (available from Mitsubishi Materials Corporation), 1.5 ml of a HSQ resist (structure: $(HSiO_{3/2})_n$, Fox-12 available from Dow Corning Corporation) was dropped, and spin coating of 2000 revolutions for 60 seconds by the use of a spin coater (manufactured by MIKASA Co., Ltd.) was carried out to perform film formation.

After the film formation, the HSQ resist film was allowed to stand (prebaked) at room temperature (23° C.) for 4 minutes, and on the HSQ resist film, 1.5 ml of the composition 1 of the present example was dropped, then spin coating of 2000 revolutions for 60 seconds (spin coater: manufactured by MIKASA Co., Ltd.) was carried out, and the composition was allowed to stand (baked) at room temperature (23° C.) for 90 seconds to prepare a coating film (film thickness: 15 nm) of the composition 1. Thus, a specimen was obtained.

Surface resistivity and film thickness of the resulting specimen were measured in the following manner. Further, the specimen was irradiated with an electron beam under the following conditions to measure sensitivity ratio and sensitivity ratio after the lapse of time. The results are set forth in Table 2.

Method for Measuring Surface Resistance

The coating film formed from the composition by a spin coater as above was allowed to stand for 30 minutes at room temperature, and then surface resistance was measured by the use of a surface resistance measuring device Megaresta MODEL HT-301 (manufactured by Shishido Electrostatic, Ltd.).

Method for Measuring Thickness of Coating Film of Composition

The thickness of the resist and the thickness of the coating film of the composition were measured by Surfcom 900A (manufactured by Tokyo Seimitsu Co., Ltd.).

Method for Measuring Sensitivity Ratio and Sensitivity Ratio after Lapse of Time Immediately after the preparation of the coating film of the composition, the HSQ thin film of 130 nm thickness prepared in Example 7 was irradiated with an electron beam at an acceleration voltage of 100 kV and an irradiation current of 6 nA in an arbitrary exposure dose using an electron beam exposure device of JBX-9300FS model manufactured by JEOL Ltd. so that a pattern having a line width of about 20 nm might be formed.

The specimen having been exposed to an electron beam was immersed in running deionized water for 2 minutes to remove the composition. After excess water was removed from the resist by dry air, the specimen was immersed in a 25% aqueous solution of tetramethylammonium hydroxide (abbreviated to TMAH hereinafter) at 23° C. for 7.5 minutes and subsequently immersed in running deionized water for 5 minutes to perform water washing, whereby a resist pattern was obtained.

A minimum exposure dose of an electron beam required to obtain a pattern having a line width of about 20 nm in the case where no composition was applied (Comparative Example 5) was taken as a reference exposure dose, and a reciprocal number of a ratio of an exposure dose required to obtain a pattern having a line width of about 20 nm in the specimen obtained in Example 7 to the reference exposure dose was defined as a sensitivity ratio.

The sensitivity ratio after the lapse of time was determined in the following manner. A sensitivity ratio was obtained in the same manner as in the above measurement of a sensitivity ratio, except that irradiation with an electron beam was carried out after the lapse of 30 hours since the specimen was placed in the exposure device after the preparation of the coating film of the composition. The thus obtained sensitivity ratio was defined as a sensitivity ratio after the lapse of time.

Examples 8 to 10

Surface sensitivity, sensitivity ratio and sensitivity ratio after the lapse of time were determined by carrying out the same operations as in Example 7, except that the thickness of the film of the composition was changed to 10 nm, 25 nm or 30 nm. The results are set forth in Table 2.

Example 11

On a 75 mm silicon wafer (available from Mitsubishi Materials Corporation), 1.5 ml of a HSQ resist (structure: $(HSiO_{3/2})_n$, Fox-12 available from Dow Corning Corporation) was dropped, and spin coating of 2000 revolutions for 60 seconds by the use of a spin coater (manufactured by MIKASA Co., Ltd.) was carried out to perform film formation.

After the film formation, the HSQ resist film was allowed to stand (prebaked) at room temperature (23° C.) for 4 minutes, and on the HSQ resist film, 1.5 ml of the composition 1 of the present example was dropped, then spin coating of 2000 revolutions for 60 seconds (spin coater: manufactured by MIKASA Co., Ltd.) was carried out, and the composition was allowed to stand (baked) at room temperature (23° C.) for 90 seconds to prepare a coating film (film thickness: 15 nm) of the composition 1. Thus, a specimen was obtained.

The film thickness of the resulting specimen was measured in the following manner. Further, the specimen was irradiated with an electron beam under the following conditions to measure sensitivity ratio and sensitivity ratio after the lapse of time. The results are set forth in Table 3.

Method for Measuring Thickness of Coating Film of Composition

The thickness of the resist and the thickness of the coating film of the composition were measured by Surfcom 900A (manufactured by Tokyo Seimitsu Co., Ltd.).

Method for Measuring Sensitivity Ratio and Sensitivity Ratio after Lapse of Time The specimen was stored in the atmosphere for 2 months. Then, immediately after the specimen was placed in an electron beam exposure device of JBX-9300FS model manufactured by JEOL Ltd., the specimen was irradiated with an electron beam at an acceleration voltage of 100 kV and an irradiation current of 6 nA in an arbitrary exposure dose using the above device so that a pattern having a line width of about 20 nm might be formed.

The specimen having been exposed to an electron beam was immersed in running deionized water for 2 minutes to remove the composition. After excess water was removed from the resist by dry air, the specimen was immersed in a 25% aqueous solution of tetramethylammonium hydroxide (abbreviated to TMAH hereinafter) at 23° C. for 7.5 minutes and subsequently immersed in running deionized water for 5 minutes to perform water washing, whereby a resist pattern was obtained.

A minimum exposure dose of an electron beam required to obtain a pattern having a line width of about 20 nm in the case where the resist was stored in the atmosphere for 2 months without applying the composition (Comparative Example 6) was taken as a reference exposure dose, and a reciprocal number of a ratio of an exposure dose required to obtain a pattern having a line width of about 20 nm after the specimen obtained in Example 11 was stored in the atmosphere for 2 months to the reference exposure dose was defined as a sensitivity ratio.

The sensitivity ratio after the lapse of time was determined in the following manner. A sensitivity ratio was obtained in the same manner as in the above measurement of a sensitivity ratio, except that irradiation with an electron beam was carried out after the lapse of 40 hours since the specimen of Example 11 was placed in the exposure device after it was stored for 2 months as above. The thus obtained sensitivity ratio was defined as a sensitivity ratio after the lapse of time.

Example 12

A specimen was obtained by carrying the same operations as in Example 11, except that the HSQ resist was applied onto the substrate, allowed to stand (prebaked) at room temperature (23° C.) for 4 minutes and then stored in the atmosphere for 2 months, and immediately before irradiation with an electron beam, the composition 1 was applied in a film thickness of 15 nm and allowed to stand (baked) at room temperature (23° C.) for 90 seconds. The film thickness was measured by the above method. The result is set forth in Table 3.

A minimum exposure dose of an electron beam required to obtain a pattern having a line width of about 20 nm in the case where the resist was stored in the atmosphere for 2 months without applying the composition (Comparative Example 6) was taken as a reference exposure dose, and a reciprocal number of a ratio of an exposure dose required to obtain a pattern having a line width of about 20 nm in the specimen of Example 12 to the reference exposure dose was defined as a sensitivity ratio.

The sensitivity ratio after the lapse of time was determined in the following manner. A sensitivity ratio was obtained in the same manner as in the above measurement of a sensitivity ratio, except that irradiation with an electron beam was carried out after the lapse of 40 hours since the specimen obtained in Example 12 was placed in the exposure device. The thus obtained sensitivity ratio was defined as a sensitivity ratio after the lapse of time. The results of sensitivity ratio and sensitivity ratio after the lapse of time are set forth in Table 3.

Comparative Example 5

Surface resistivity, sensitivity ratio and sensitivity ratio after the lapse of time were determined by carrying out the same operations as in Example 7, except that the composition 1 was not used. The results are set forth in Table 2.

Comparative Example 6

Sensitivity ratio and sensitivity ratio after the lapse of time were determined by carrying out the same operations as in Example 11, except that the composition 1 was not used. The results are set forth in Table 3.

The electron beam irradiation conditions in Examples 1 to 6 and Comparative Examples 1 to 4 are different from those in Example 7 to 12 and Comparative Examples 5 and 6.

The reason is that in Examples 1 to 6 and Comparative Examples 1 to 4, nanometer lithography aiming at resolution limit of HSQ was carried out, and such lithography was carried out in conformity with the actual circumstances where a current of several hundreds picoamperes (decreased throughput but low current) is usually used. On the other hand, in Examples 7 to 12 and Comparative Examples 5 and 6, lithography purposing to prepare optical elements, nanoimprint templates, etc. was carried out, and such lithography was carried out in conformity with the actual circumstances where a beam current of usually more than several nanoamperes or more than 10 nanoamperes is used in order to enhance throughput in the preparation of such patterns.

TABLE 1

| Example | Composition Type | Composition Film thickness (nm) | Water-soluble conductive polymer compound Type | ABS (part(s) by mass) | PEO (part(s) by mass) | W42SP (part(s) by mass) | Pre-baking temperature (° C.) | Baking temperature (° C.) | Resist file thickness (nm) | Sensitivity ratio | Sensitivity ratio after the lapse of time (4 hours or more) | Surface resistance (Ω/□) | pH |
|---|---|---|---|---|---|---|---|---|---|---|---|---|---|
| Ex. 1 | composition 1 | 15 | SDPITN | 1.0 | 0.1 | 0.1 | 0 | 40 | 40 | 30 | 1.33 | 1.33 | 2.00E+05 | pH 5 |
| Ex. 2 | composition 2 | 15 | SDPITN | 1.0 | 0.1 | 0.1 | 0.2 | 40 | 40 | 30 | 1.33 | 1.33 | 1.00E+06 | pH 5 |
| Ex. 3 | composition 3 | 15 | SDPITN | 1.0 | 0.1 | 0 | 0 | 40 | 40 | 30 | 1.33 | 1.33 | 8.00E+05 | pH 4 |
| Ex. 4 | composition 4 | 15 | SDPAn | 1.0 | 0.1 | 0 | 0 | 40 | 40 | 30 | 1.33 | 1.33 | 7.00E+06 | pH 4 |
| Ex. 5 | composition 5 | 15 | SDPT | 1.0 | 0.1 | 0 | 0 | 40 | 40 | 30 | 1.33 | 1.33 | 3.00E+07 | pH 4 |
| Ex. 6 | composition 1 | 15 | SDPITN | 1.0 | 0.1 | 0.1 | 0 | 200 | 200 | 30 | 1.50 | 1.50 | 2.00E+05 | pH 5 |
| Comp. Ex. 1 | unused | — | — | — | — | — | — | 40 | 40 | 30 | 1.00 | 0.70 | — | — |
| Comp. Ex. 2 | composition 6 | 15 | — | 0.0 | 0.1 | 0.1 | 0 | 40 | 40 | 30 | 0.80 | 0.64 | >1E+10 | pH 5 |
| Comp. Ex. 3 | composition 1 | 15 | SDPITN | 1.0 | 0.1 | 0.1 | 0 | 360 | 40 | 30 | 0.43 | 0.39 | 2.00E+05 | pH 5 |
| Comp. Ex. 4 | composition 1 | 15 | SDPITN | 1.0 | 0.1 | 0.1 | 0 | 40 | 360 | 30 | 0.50 | 0.45 | 2.00E+05 | pH 5 |

SDPITN: poly(5-sulfoisothianaphthene-1,3-diyl)
SDPan: poly(aniline-3-sulfonic acid)
SDPT: poly(3-(3-thienyl)propanesulfonic acid
ABS: straight-chain akybenzenesulfonic chain
PEO: polyethylene oxide
W42SP: hydrolyzed collagen

TABLE 2

| Example | Composition Type | Resist Film thickness (nm) | Film thickness (nm) | Sensitivity ratio | Sensitivity ratio after the lapse of time (30 hours) | Surface resistance (Ω/□) |
|---|---|---|---|---|---|---|
| Ex. 7 | composition 1 | 15 | 130 | 1.04 | 1.04 | 2.00E+05 |
| Ex. 8 | composition 1 | 10 | 130 | 1.04 | 1.04 | 2.00E+05 |
| Ex. 9 | composition 1 | 25 | 130 | 1.04 | 1.04 | 2.00E+05 |
| Ex. 10 | composition 1 | 30 | 130 | 1.07 | 1.07 | 2.00E+05 |
| Comp. Ex. 5 | unused | — | 130 | 1.00 | 0.91 | 2.00E+05 |

TABLE 3

| Example | Composition Type | Composition Film thickness (nm) | Resist Film thickness (nm) | Sensitivity Sensitivity ratio | Sensitivity ratio after the lapse of time (40 hours) |
|---|---|---|---|---|---|
| Ex. 11 | composition 1 | 15 | 130 | 1.11 | 1.11 |
| Ex. 12 | composition 1 | 15 | 130 | 1.07 | 1.07 |
| Comp. Ex. 6 | unused | — | 130 | 1.00 | 0.91 |

The sensitivity improvement ratio of Examples 1 to 6 owing to the composition application effect is about 30%, and the sensitivity improvement ratio after the lapse of 4 hours or more from the beginning of exposure was about 90% (the sensitivity improvement ratio is a sensitivity improvement ratio of Example 1 given when the sensitivity of Comparative Example 1 is taken as a reference, that is, a value determined by the formula "Sensitivity of Example 1—Sensitivity of Comparative Example 1/Sensitivity of Comparative Example 1".

The sensitivity improvement ratio of Examples 7 to 10 owing to the composition application effect is in the range of 4% to 7%, and the sensitivity improvement ratio after the lapse of time in the case of exposure after storage of more than 30 hours was in the range of 14% to 18%.

The reason why the sensitivity improvement ratios differ from one another depending upon the examples, that is, electron beam irradiation conditions, as described above is as follows.

Since HSQ is a resist of low sensitivity, drawing of a pattern takes time. If a change of sensitivity occurs in the pattern drawing, in-plane uniformity of the pattern is lost. Therefore, when the composition is not applied, destruction of the pattern takes place with the lapse of time in the pattern drawing, and homogeneous exposure of the exposure target material is inhibited. On the other hand, when the composition is applied onto the HSQ, the HSQ sensitivity is maintained during the exposure, and therefore, homogeneous exposure of the exposure target material becomes possible.

When a pattern of 20 nm is drawn in a HSQ film having a film thickness of 130 nm as in Examples 7 to 12, the aspect ratio of the pattern (ratio of horizontal length, i.e., pattern width, to vertical length, i.e., film thickness, in rectangular shape of pattern section) exceeds 6. Under such drawing conditions, even lowering of sensitivity of a resist by about 4% induces destruction of the pattern, resulting in a problem of loss of in-plane uniformity of the pattern.

On the other hand, when a pattern of 20 nm is drawn in a HSQ film having a film thickness of 30 nm as in Examples 1 to 6, lowering of sensitivity by several tens % makes pattern formation impossible because of insufficient exposure dose, resulting in a problem of loss of in-plane uniformity of the pattern.

The invention claimed is:

1. A method for improving sensitivity of a resist, which is a method to improve sensitivity of a resist formed from hydrosilsesquioxane to a charged particle beam when a pattern is formed in the resist by irradiation with a charged particle beam, and comprises:

prebaking a resist applied onto a substrate and formed from hydrosilsesquioxane, at t° C. ($20 \leq t \leq 300$), applying a composition containing a water-soluble conductive polymer compound to a charged particle beam irradiation surface of the prebaked resist, baking the thus applied composition at T° C. ($0 \leq T < t+40$), and then irradiating the resist with a charged particle beam.

2. The method for improving sensitivity of a resist as claimed in claim 1, wherein the charged particle beam is an electron beam or an ion beam.

3. The method for improving sensitivity of a resist as claimed claim 1, wherein the water-soluble conductive polymer compound is a π-conjugated conductive polymer compound having a Brønsted acid group or a group that is a salt of Brønsted acid.

4. The method for improving sensitivity of a resist as claimed in claim 3, wherein the Brønsted acid is sulfonic acid.

5. The method for improving sensitivity of a resist as claimed in claim 4, wherein the water-soluble conductive polymer compound contains a chemical structure represented by the following formula (1):

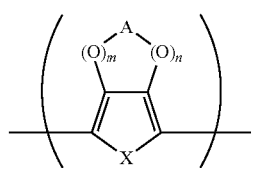

(1)

wherein m and n are each independently 0 or 1,

X is S, N—$R^1$ ($R^1$ is a group selected from the group consisting of a hydrogen atom, a straight-chain or branched saturated or unsaturated monovalent hydrocarbon group of 1 to 20 carbon atoms, a phenyl group and a substituted phenyl group) or O, A is a saturated or unsaturated hydrocarbon group of 1 to 4 carbon atoms, which has at least one substituent represented by —B—$SO_3^-M^+$ and forms a straight-chain structure together with —(O)$_m$— and —(O)$_n$—, the saturated or unsaturated hydrocarbon group of 1 to 4 carbon atoms may have, as a substituent, a straight-chain or branched saturated or unsaturated hydrocarbon group of 1 to 20 carbon atoms, a straight-chain or branched saturated or unsaturated alkoxy group of 1 to 20 carbon atoms, a hydroxyl group, a halogen atom, a nitro group, a cyano group, a trihalomethyl group, a phenyl group or a substituted phenyl group, B is —$(CH_2)_p$—$(O)_q$—$(CH_2)_r$—, p and r are each independently an integer of 0 to 3, q is 0 or 1, and $M^+$ is a hydrogen ion, an alkali metal ion or a quaternary ammonium ion.

6. The method for improving sensitivity of a resist as claimed in claim 4, wherein the water-soluble conductive polymer compound contains a chemical structure represented by the following formula (2):

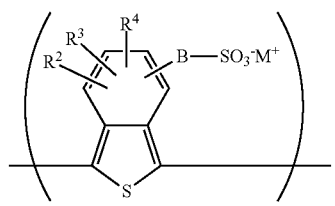

(2)

wherein $R^2$ to $R^4$ are each independently a hydrogen atom, a straight-chain or branched saturated or unsaturated hydrocarbon group of 1 to 20 carbon atoms, a straight-chain or branched saturated or unsaturated alkoxy group of 1 to 20 carbon atoms, a hydroxyl group, a halogen atom, a nitro group, a cyano group, a trihalomethyl group, a phenyl group, a substituted phenyl group or a —B—SO$_3^-$M$^+$ group, B is —(CH$_2$)$_p$—(O)$_q$—(CH$_2$)$_r$—, p and r are each independently an integer of 0 to 3, q is 0 or 1, and M$^+$ is a hydrogen ion, an alkali metal ion or a quaternary ammonium ion.

7. The method for improving sensitivity of a resist as claimed in claim 4, wherein the water-soluble conductive polymer compound contains a chemical structure represented by the following formula (3):

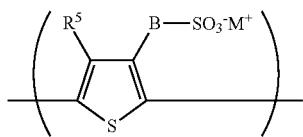

(3)

wherein R$^5$ is a hydrogen atom, a straight-chain or branched saturated or unsaturated hydrocarbon group of 1 to 20 carbon atoms, a straight-chain or branched saturated or unsaturated alkoxy group of 1 to 20 carbon atoms, a hydroxyl group, a halogen atom, a nitro group, a cyano group, a trihalomethyl group, a phenyl group, a substituted phenyl group or a —B—SO$_3^-$M$^+$ group, B is —(CH$_2$)$_p$—(O)$_q$—(CH$_2$)$_r$—, p and r are each independently an integer of 0 to 3, q is 0 or 1, and M$^+$ is a hydrogen ion, an alkali metal ion or a quaternary ammonium ion.

8. The method for improving sensitivity of a resist as claimed in claim 4, wherein the water-soluble conductive polymer compound contains a chemical structure represented by the following formula (4):

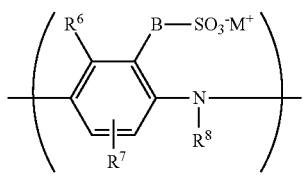

(4)

wherein R$^6$ and R$^7$ are each independently a hydrogen atom, a straight-chain or branched saturated or unsaturated hydrocarbon group of 1 to 20 carbon atoms, a straight-chain or branched saturated or unsaturated alkoxy group of 1 to 20 carbon atoms, a hydroxyl group, a halogen atom, a nitro group, a cyano group, a trihalomethyl group, a phenyl group, a substituted phenyl group or a —B—SO$_3^-$M$^+$ group, R$^8$ is a monovalent group selected from the group consisting of a hydrogen atom, a straight-chain or branched saturated or unsaturated hydrocarbon group of 1 to 20 carbon atoms, a phenyl group and a substituted phenyl group, B is —(CH$_2$)$_p$—(O)$_q$—(CH$_2$)$_r$—, p and r are each independently an integer of 0 to 3, q is 0 or 1, and M$^+$ is a hydrogen ion, an alkali metal ion or a quaternary ammonium ion.

9. The method for improving sensitivity of a resist as claimed in claim 6, wherein the water-soluble conductive polymer compound is a polymer containing at least one substance selected from a polymer containing 5-sulfoisothianaphthene-1,3-diyl, poly(aniline-2-sulfonic acid) and poly(3-(3-thienyl)propanesulfonic acid).

10. The method for improving sensitivity of a resist as claimed in claim 1, wherein the composition containing a water-soluble conductive polymer compound is an antistatic agent.

11. The method for improving sensitivity of a resist as claimed in claim 1, wherein the composition containing a water-soluble conductive polymer compound contains the water-soluble conductive polymer compound in an amount of 0.1 to 20% by mass and a solvent in an amount of 80 to 99.9% by mass.

12. The method for improving sensitivity of a resist as claimed in claim 1, wherein the hydrosilsesquioxane has a structure represented by (HSiO$_{3/2}$)$_n$ (n is an integer of 3 to 100).

13. The method for improving sensitivity of a resist as claimed in claim 1, which is a method to improve sensitivity of a resist when a semiconductor is produced.

14. The method for improving sensitivity of a resist as claimed in claim 1, which is a method to improve sensitivity of a resist when a nanoimprint mold is produced.

15. The method for improving sensitivity of a resist as claimed in claim 1, which is a method to improve sensitivity of a resist when a reticle is produced.

16. The method for improving sensitivity of a resist as claimed in claim 2, wherein the water-soluble conductive polymer compound is a π-conjugated conductive polymer compound having a Brønsted acid group or a group that is a salt of Brønsted acid.

17. The method for improving sensitivity of a resist as claimed in claim 16, wherein the Brønsted acid is sulfonic acid.

18. The method for improving sensitivity of a resist as claimed in claim 17, wherein the water-soluble conductive polymer compound contains a chemical structure represented by the following formula (1):

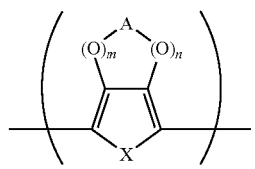

(1)

wherein m and n are each independently 0 or 1,

X is S, N—R$^1$ (R$^1$ is a group selected from the group consisting of a hydrogen atom, a straight-chain or branched saturated or unsaturated monovalent hydrocarbon group of 1 to 20 carbon atoms, a phenyl group and a substituted phenyl group) or O, A is a saturated or unsaturated hydrocarbon group of 1 to 4 carbon atoms, which has at least one substituent represented by —B—SO$_3^-$M$^+$ and forms a straight-chain structure together with —(O)$_m$— and —(O)$_n$—, the saturated or unsaturated hydrocarbon group of 1 to 4 carbon atoms may have, as a substituent, a straight-chain or branched saturated or unsaturated hydrocarbon group of 1 to 20 carbon atoms, a straight-chain or branched saturated or unsaturated alkoxy group of 1 to 20 carbon atoms, a hydroxyl group, a halogen atom, a nitro group, a cyano group, a trihalomethyl group, a phenyl group or a substituted phenyl group, B is —(CH$_2$)$_p$—(O)$_q$—(CH$_2$)$_r$—, p and r are each independently an integer of 0 to 3, q is 0 or 1, and M$^+$ is a hydrogen ion, an alkali metal ion or a quaternary ammonium ion.

19. The method for improving sensitivity of a resist as claimed in claim 17, wherein the water-soluble conductive polymer compound contains a chemical structure represented by the following formula (2):

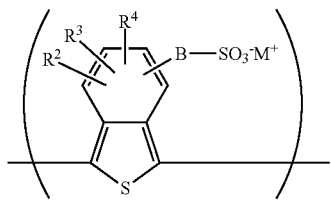

(2)

wherein $R^2$ to $R^4$ are each independently a hydrogen atom, a straight-chain or branched saturated or unsaturated hydrocarbon group of 1 to 20 carbon atoms, a straight-chain or branched saturated or unsaturated alkoxy group of 1 to 20 carbon atoms, a hydroxyl group, a halogen atom, a nitro group, a cyano group, a trihalomethyl group, a phenyl group, a substituted phenyl group or a —B—$SO_3^-M^+$ group, B is —$(CH_2)_p$—$(O)_q$—$(CH_2)_r$—, p and r are each independently an integer of 0 to 3, q is 0 or 1, and $M^+$ is a hydrogen ion, an alkali metal ion or a quaternary ammonium ion.

20. The method for improving sensitivity of a resist as claimed in claim 17, wherein the water-soluble conductive polymer compound contains a chemical structure represented by the following formula (3):

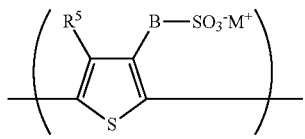

(3)

wherein $R^5$ is a hydrogen atom, a straight-chain or branched saturated or unsaturated hydrocarbon group of 1 to 20 carbon atoms, a straight-chain or branched saturated or unsaturated alkoxy group of 1 to 20 carbon atoms, a hydroxyl group, a halogen atom, a nitro group, a cyano group, a trihalomethyl group, a phenyl group, a substituted phenyl group or a —B—$SO_3^-M^+$ group, B is —$(CH_2)_p$—$(O)_q$—$(CH_2)_r$—, p and r are each independently an integer of 0 to 3, q is 0 or 1, and $M^+$ is a hydrogen ion, an alkali metal ion or a quaternary ammonium ion.

21. The method for improving sensitivity of a resist as claimed in claim 17, wherein the water-soluble conductive polymer compound contains a chemical structure represented by the following formula (4):

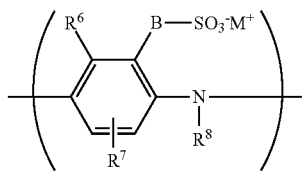

(4)

wherein $R^6$ and $R^7$ are each independently a hydrogen atom, a straight-chain or branched saturated or unsaturated hydrocarbon group of 1 to 20 carbon atoms, a straight-chain or branched saturated or unsaturated alkoxy group of 1 to 20 carbon atoms, a hydroxyl group, a halogen atom, a nitro group, a cyano group, a trihalomethyl group, a phenyl group, a substituted phenyl group or a —B—$SO_3^-M^+$ group, $R^8$ is a monovalent group selected from the group consisting of a hydrogen atom, a straight-chain or branched saturated or unsaturated hydrocarbon group of 1 to 20 carbon atoms, a phenyl group and a substituted phenyl group, B is —$(CH_2)_p$—$(O)_q$—$(CH_2)_r$—, p and r are each independently an integer of 0 to 3, q is 0 or 1, and $M^+$ is a hydrogen ion, an alkali metal ion or a quaternary ammonium ion.

22. The method for improving sensitivity of a resist as claimed in claim 19, wherein the water-soluble conductive polymer compound is a polymer containing at least one substance selected from a polymer containing 5-sulfoisothianaphthene-1,3-diyl, poly(aniline-2-sulfonic acid) and poly(3-(3-thienyl)propanesulfonic acid).

\* \* \* \* \*